United States Patent
Pol

(10) Patent No.: US 10,634,571 B2
(45) Date of Patent: Apr. 28, 2020

(54) PRESSURE-EQUALIZATION ELEMENT FOR A FIELD DEVICE USED IN AUTOMATION TECHNOLOGY

(71) Applicant: Endrses + Hauser GmbH + Co. KG, Maulburg (DE)

(72) Inventor: Ioan-Mircea Pol, Lorrach (DE)

(73) Assignee: ENDRESS+HAUSER SE+CO.KG, Maulburg (DE)

(*) Notice: Subject to any disclaimer, the term of this patent is extended or adjusted under 35 U.S.C. 154(b) by 53 days.

(21) Appl. No.: 15/533,133

(22) PCT Filed: Nov. 30, 2015

(86) PCT No.: PCT/EP2015/078011
§ 371 (c)(1),
(2) Date: Jun. 5, 2017

(87) PCT Pub. No.: WO2016/091631
PCT Pub. Date: Jun. 16, 2016

(65) Prior Publication Data
US 2017/0322099 A1    Nov. 9, 2017

(30) Foreign Application Priority Data

Dec. 12, 2014    (DE) .................. 10 2014 118 541

(51) Int. Cl.
*G01L 19/06*    (2006.01)
*F16K 24/00*    (2006.01)
(Continued)

(52) U.S. Cl.
CPC .......... *G01L 19/0654* (2013.01); *F16K 24/00* (2013.01); *G01L 13/00* (2013.01); *H05K 5/0213* (2013.01)

(58) Field of Classification Search
CPC ..... G01L 19/0654; G01L 13/00; F16K 24/00; H05K 5/0213
See application file for complete search history.

(56) References Cited

U.S. PATENT DOCUMENTS 8,109,148 B2    2/2012    Habibi
8,277,295 B2    10/2012    Yano
(Continued)

FOREIGN PATENT DOCUMENTS

CN    101395037 A    3/2009
CN    10 2548459 A    7/2012
(Continued)

OTHER PUBLICATIONS

German Search Report, German Patent Office, Munich, DE, dated Jun. 22, 2015.
(Continued)

*Primary Examiner* — Peter J Maachiarolo
*Assistant Examiner* — John M Royston
(74) *Attorney, Agent, or Firm* — Bacon & Thomas, PLLC

(57) ABSTRACT

A pressure-equalization element for equalization of pressure differences between at least two spatial areas assigned to a field device used in automation technology, comprising a main body, consisting of a securing element having an axial bore, that is used for securing the pressure-equalization element in a wall of the field device, and a disc-shaped carrier component having a lateral end surface. The disc-shaped carrier component is provided with a specified number (n, where n>2) of substantially radially-running recesses corresponding to the axial bore, wherein the radially-running recesses are offset from one another by a defined angular offset, and wherein the radially-running recesses are provided with a gas-permeable, liquid-barrier (Continued)

membrane in the region of the lateral end surface of the disc-shaped carrier components.

7 Claims, 3 Drawing Sheets

(51) Int. Cl.
*G01L 13/00* (2006.01)
*H05K 5/02* (2006.01)

(56) References Cited

U.S. PATENT DOCUMENTS

| | | | |
|---|---|---|---|
| 2012/0137784 A1* | 6/2012 | Krusemark | G01L 19/0645 73/724 |
| 2017/0322099 A1 | 11/2017 | Pol | |

FOREIGN PATENT DOCUMENTS

| | | |
|---|---|---|
| DE | 202008005548 U1 | 8/2008 |
| DE | 202008007375 U1 | 1/2009 |
| DE | 102008018900 A1 * | 10/2009 ............. H05K 5/068 |
| DE | 102008018900 A1 | 10/2009 |
| DE | 102009003149 A1 | 11/2010 |
| DE | 202011108899 U1 | 3/2012 |
| DE | 102012109632 A1 | 4/2014 |
| DE | 102014118541 A1 | 6/2016 |
| EP | 1997685 A1 | 12/2008 |
| EP | 2842714 A2 | 3/2015 |

OTHER PUBLICATIONS

International Search Report, EPO, The Netherlands, dated Feb. 10, 2016.
English Translation of the International Preliminary Report on Patentability, WIPO, Geneva, CH, dated Jun. 22, 2017.
Chinese Office Action in corresponding Chinese Application No. 201580067481.0, dated Nov. 6, 2018.
Chinese Office Action in corresponding Chinese Application No. 201580067481.0, dated Jun. 17, 2019.

* cited by examiner

PRESSURE-EQUALIZATION ELEMENT FOR A FIELD DEVICE USED IN AUTOMATION TECHNOLOGY

TECHNICAL FIELD

The invention relates to a pressure-equalization element.

BACKGROUND DISCUSSION

Sensors serve to detect process variables in automation technology that, for example, are integrated in fill-level measuring devices, flow measuring devices, pressure and temperature measuring devices, analytical measuring devices, etc. The devices detect the corresponding process variables: the fill-level, flow, pressure, temperature, analytical data such as the pH, opacity, or conductivity. Actuators, such as, for example, valves or pumps, are used to influence process variables. The flow rate of a fluid in a pipeline section or a fill-level in a container can thus be altered by means of actuators. Sensors and actuators are generally designated field devices. In conjunction with the invention, field devices accordingly designate all devices which are process-oriented and which provide or edit process-relevant information.

German patent, DE 10 2012 109 632 A1 discloses a measuring sensor for the meteorological detection of a pressure to be measured as relative pressure in comparison to a reference pressure that predominates in the surroundings of the measuring sensor. The measuring sensor has the following components: a housing, a relative pressure sensor arranged in the housing, a pressure supply by means of which the pressure to be measured is supplied to the relative pressure sensor, and a reference pressure supply by means of which the reference pressure is supplied to the relative pressure sensor. The reference pressure supply terminates in an opening in an outer wall of the housing, against the outside of which the reference pressure acts. A closure is inserted in an end region facing the opening that seals to the outside the inner chamber of the reference pressure supply located on the side of the closure facing away from the opening. Moreover, a capillary tube is provided through which a region of the reference pressure supplier located on the side of closure facing away from the relative pressure sensor is connected by a hole leading through the closure to the inner chamber of the reference pressure supply sealed by the closure.

This solution prevents moisture from entering the interior of the reference pressure sensor. It should be noted that the penetration of moisture substantially impairs the measuring precision of the measuring sensor and, in an extreme case, can lead to the complete failure of the pressure-measuring pressure sensor.

German patent, DE 20 2011 108 899 U1 discloses a relative pressure-measuring transducer that has a housing, a pressure sensor with a pressure-measuring transducer for providing a pressure-dependent electric primary signal, and an electronic circuit for driving the pressure-measuring transducer and for processing the primary signal in order to provide a primary-signal-dependent signal as a measured value at an output of the electronic circuit. The pressure sensor and the electronic circuit are arranged in the housing. The housing has a media pressure opening and a reference air path, wherein a pressure sensor can be supplied with media pressure through the media pressure opening, and with surrounding air through the reference air path for providing the atmospheric pressure. The reference air path comprises a filter element that protects the pressure sensor against the penetration of moisture. The reference air path has at least two reference air openings in a surface of the housing, wherein at least one opening path runs from each filter element to the reference air opening. The opening paths are positioned and oriented relative to each other such that an opening path runs from at least one filter element to a reference air opening without an ascent. This allows water to drain from the filter element.

German patent, DE 10 2008 018 900 A1 discloses a pressure-equalization threaded joint with a tubular membrane and adjustable volumetric flow. The pressure-equalization threaded joint has a breathable, semipermeable lead-through, and consists of a bottom part and a cover as the top part. The two parts are connected to each other. The bottom part is formed by a hollow cylinder. Radial ventilation channels are provided between the top edge of the bottom part and the cover. The tubular membrane is arranged in the hollow cylinder of the bottom part. The axial dimension of the tubular membrane is selected such that its top edge is in contact with the inner surface of the cover, and its bottom edge is in contact with an inner surface bordering the hollow cylinder of the bottom part.

Since the flexible tubular membrane does not have a specific contact surface in the radial direction and is not attached in a form fit in the pressure-equalization threaded joint, the danger exists that an inflowing or outflowing gaseous medium will not follow the path identified in FIG. 5, but will rather flow along the top or bottom edge of the tubular membrane and leave the housing unfiltered through the radial opening 49, or will flow unfiltered into the housing.

SUMMARY OF THE INVENTION

The object of the invention is to propose a pressure-equalization element that reliably fulfills its filtration function independently of the installed position of an automation field device.

The invention relates to a pressure-equalization element for equalization of pressure differences between at least two spatial areas assigned to a field device used in automation technology, comprising a main body that consists of a securing element having an axial bore and is used for securing the pressure-equalization element in a wall of the field device, and a disc-shaped carrier component having a lateral end surface, wherein the disc-shaped carrier component is provided with a specified number of substantially radially-running cutouts corresponding to the axial bore, wherein the radially-running cutouts are offset from one another by a defined angular offset, and wherein the radially-running cutouts are provided with a gas-permeable, liquid-barrier membrane in the region of the lateral end surface of the disc-shaped carrier component. According to the invention, a protective cap is provided that covers the disc-shaped support component in the region of the outer end surface and the lateral end surface. This effectively protects the membrane against soiling, sprayed water, and mechanical damage, without reducing its filtering function.

When a carrier component has a circular cross-section, the end surface will be annular or will be a radial end surface; when the cross-section has corners, the end surface will consist of a specified number of rectangular sections that are connected to each other.

The pressure-equalization element can satisfy the pressure-equalization function independently of the installed position of the field device, since it always has a plurality of available "airways." The plurality of airways corresponds to the radially-arranged cutouts in the disc-shaped carrier component that are connected to the axial bore. Even in a worst case, when one of the radially-arranged cutouts, i.e., an airway, is blocked, the pressure can be equalized via an unblocked, redundant cutout. Blocking can arise from condensation water collecting on the membrane, and/or dirt or dust being deposited thereupon.

Preferably, opening slits are provided in the protective cap in the region of the end surface through which, as the case may be, condensation water can drip, depending upon the installation position of the pressure-equalization element.

The number of radially-running cutouts terminating in the lateral end surface can be arbitrary; however, at least two cutouts must be provided. The angular offset between the radially-running cutouts can also be arbitrary. Preferably, the angular offset for a number n of radially-running cutouts is 360°/n. Consequently, two cutouts are preferably arranged diametrically, three cutouts have an angular offset of 120°, and four cutouts have an angular offset of 90°.

The pressure-equalization element according to the invention can be made of plastic and/or metal.

In one advantageous embodiment of the pressure-equalization element according to the invention, the disk-shaped carrier component has a stop edge in each of two regions of the lateral end surface that are axially offset from each other. In this embodiment, the membrane is designed as an annular band and is fastened between the two stop edges. The attachment to the lateral end surface can, for example, be strengthened by additional points of adhesion on the membrane. This embodiment makes it possible for the membrane to close all cutouts simultaneously. Of course, the membrane can also consist of individual parts which are arranged so that they close the cutouts in the region of the lateral surface.

The membrane is preferably designed to be breathable and be unidirectionally permeable to water. In addition, it preferably consists of a water-repellent, hydrophobic material. The membrane is preferably made of Gore-Tex.

Furthermore, the invention relates to an automation field device with at least one first inner chamber, wherein a pressure-equalization element according to the invention is arranged in the wall of the field device which separates the inner chamber from the surroundings of the field device. In this embodiment, the pressure-equalization element is accordingly located in the outer wall of the field device. An exemplary embodiment is described in DE 10 2012 109 632 A1.

Moreover, the invention relates to an automation field device with at least one first inner chamber and one second inner chamber, wherein the first inner chamber and the second inner chamber are separated from each other by an intermediate wall, and wherein a pressure-equalization element according to the invention is arranged in the outer wall of one of the two inner chambers. Corresponding solutions have become known under the designation 'dual seal.'

Furthermore, the invention is a relative pressure-measuring sensor for the meteorological detection of a pressure to be measured as a relative pressure in comparison to a reference pressure that predominates in the surroundings of the measuring sensor, with a relative pressure sensor arranged in a housing, a pressure supply by means of which the pressure to be measured is supplied to the relative pressure sensor, and a reference pressure supply by means of which the reference pressure is supplied to the relative pressure sensor. The reference pressure supply terminates in an opening in an outer wall of the housing. A pressure-equalization element according to the invention is inserted in the opening or in the reference pressure supply. A corresponding relative pressure sensor with which the pressure-equalization element can be used is, for example, described in the aforementioned DE 10 2012 109 632 A1.

BRIEF DESCRIPTION OF THE DRAWINGS

The invention is explained in greater detail with reference to the following figures. Illustrated are.

DETAILED DISCUSSION IN CONJUNCTION WITH THE DRAWINGS

Figure 1:
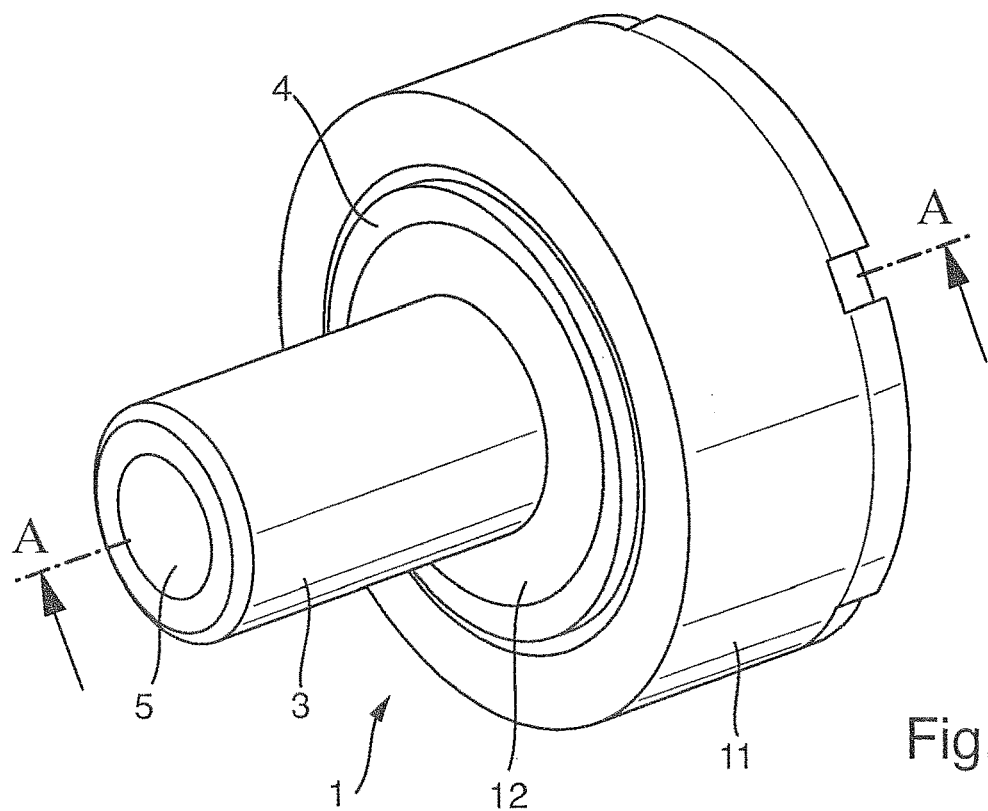
FIG. 1a: is a perspectival representation of an embodiment of the pressure-equalization element according to the invention.
Figure 2:
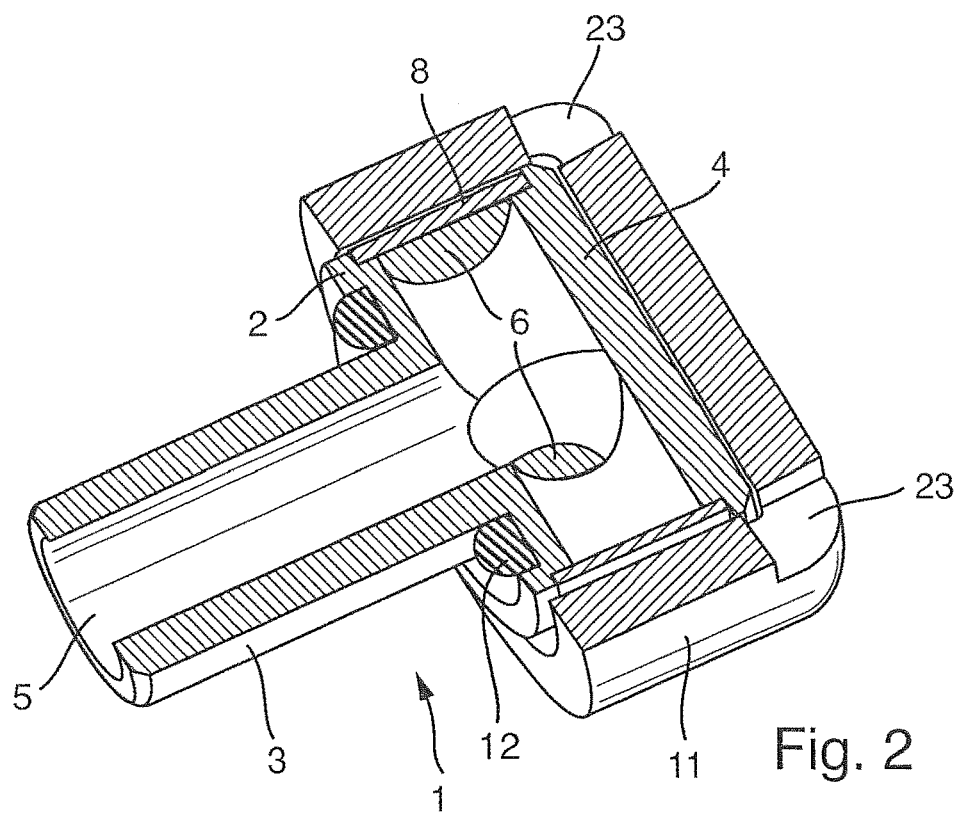
FIG. 2: is a longitudinal section according to the designation A-A through the pressure-equalization element shown in FIG. 1.
Figure 3:
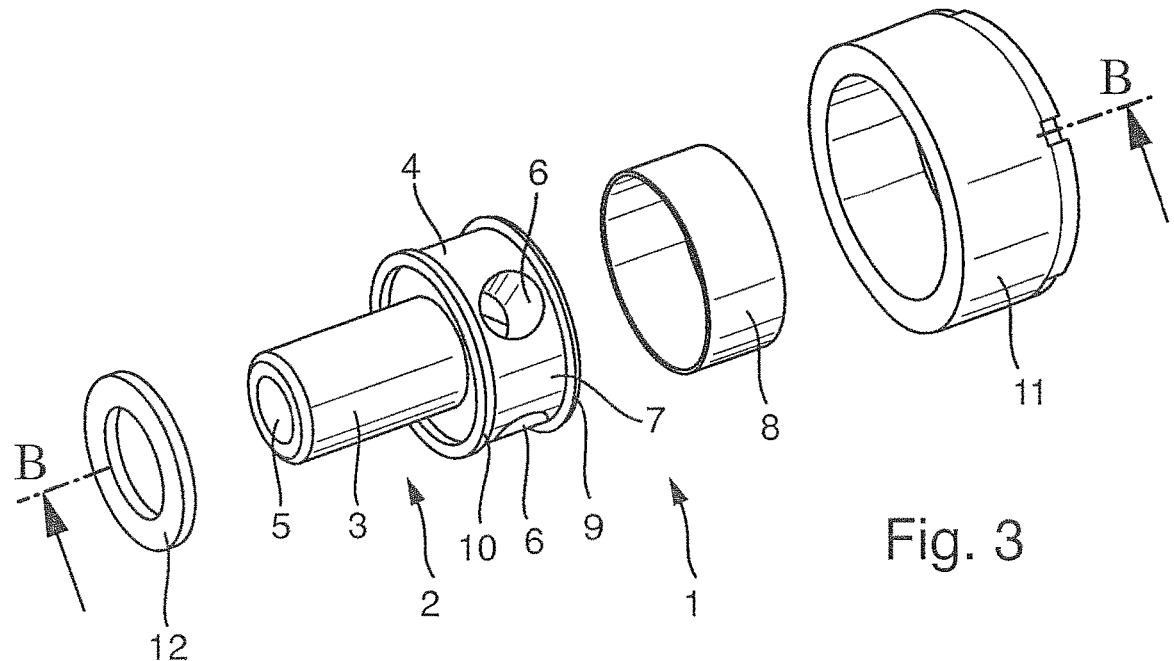
FIG. 3: is an exploded view of the embodiment of the pressure-equalization element according to the invention shown in FIG. 1.
Figure 4:
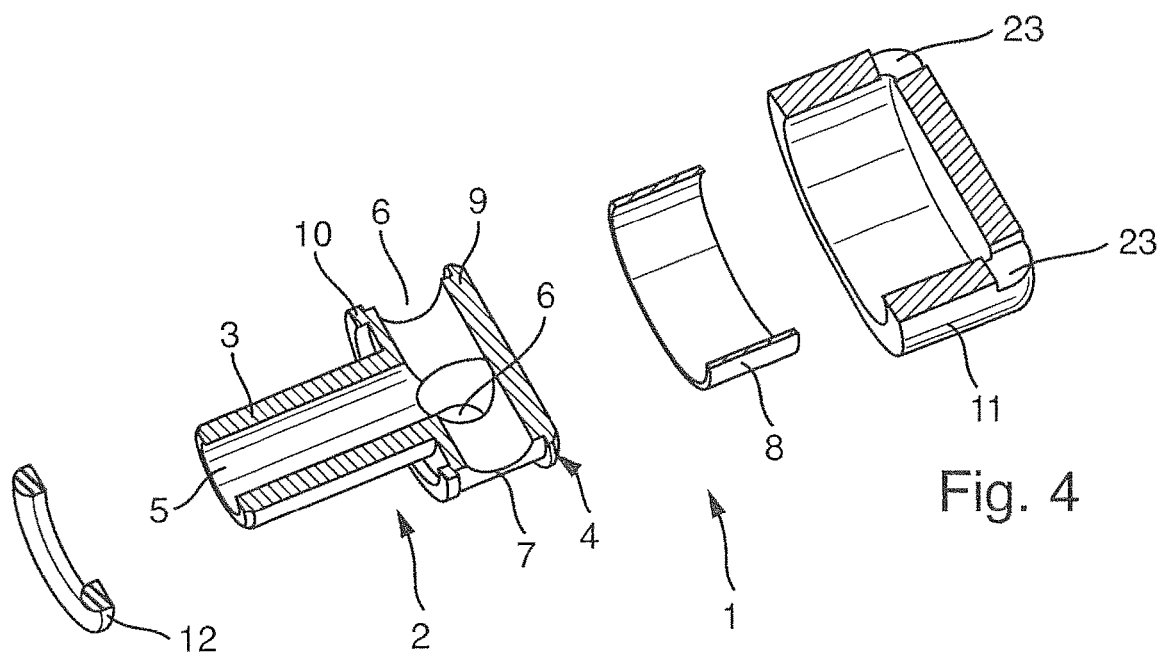
FIG. 4: is a section through the embodiment of the pressure-equalization element shown in FIG. 3 according to the designation B-B.

A preferred embodiment of the pressure compensation element 1 according to the invention will be explained in more detail with reference to the following figures. FIG. 1 shows a perspective representation, FIG. 2 shows a longitudinal section according to the designation A-A in FIG. 1, FIG. 3 shows an exploded view of the embodiment shown in FIG. 1, and FIG. 4 shows a longitudinal section of the embodiment shown in FIG. 3 according to the designation B-B. The pressure-equalization element 1 according to the invention serves to equalize differences in pressure between two spatial areas assigned to an automation field device 13. It has a main body 2 which consists of an elongated securing element 3 with an axial bore 5 which serves to fasten the pressure-equalization element 1 in a wall 15 of the field device 13, a disc-shaped carrier component 4, and a protective cap 11. The pressure-equalization element 1 is fastened in the wall 15 of the field device 13 itself by means, for example, of a threaded joint, clamping, or adhesion.

When the pressure-equalization element 1 is in an assembled state, the protective cap 1 is connected securely to the disc-shaped carrier component 4. The permanent or releasable connection is effected either by adhesion, welding—such as point welding—a mechanical threaded joint, or by elastic claws which are provided in the region of the free bottom edge of the protective cap 11. Corresponding permanent and releasable attachments are known to a person skilled in the art, so that further clarification is unnecessary.

It is advantageous when openings 22 are provided in the cover region of the protective cap 11 through which any condensate that forms can drain.

The disc-shaped carrier component 4 is bordered by a lateral end surface 7. A predetermined number (n, where n≥2) of cutouts 6 that run substantially radially and correspond with the axial bore 5 in the attachment component 3 are provided in the disc-shaped carrier component 4. The radially-running cutouts 6 which are designed as holes are offset relative to each other by a specific angular offset. In the region of the lateral end surface 7, the radially-running cutouts 6 in the disc-shaped carrier component 4 are provided with a liquid-blocking, gas-permeable membrane 8.

In the embodiment shown in the figures, the disc-shaped carrier component 4 has four radially-arranged cutouts 6. These are arranged basically at an angular offset of 90° relative to each other.

In the example shown, the top and bottom edges of the lateral end surface 7 are designed as axial stop edges 9, 10; moreover, the lateral end surface 7 serves as such a contact surface for the membrane 8. In the case presented, the annular membrane 8 is positioned between the two stop edges 9, 10. The membrane 8 closes all the cutouts 6 in the lateral end surface 7 of the disc-shaped carrier component 4. The membrane 8 is a unidirectionally water-vapor-permeable, water-repellent, breathable membrane. It is preferably made of Gore-Tex. Of course, it is sufficient for the breathable membrane 8 to cover the cutouts 6. Preferably, the annular membrane 8, or the membrane pieces covering the cutouts 6, are securely connected to the surface, or parts of the surface, of the lateral end surface 7. The seal 12 ensures that the gaseous medium flows exclusively through the radially-arranged cutouts 6 that are provided with a membrane 8.

Figure 5:
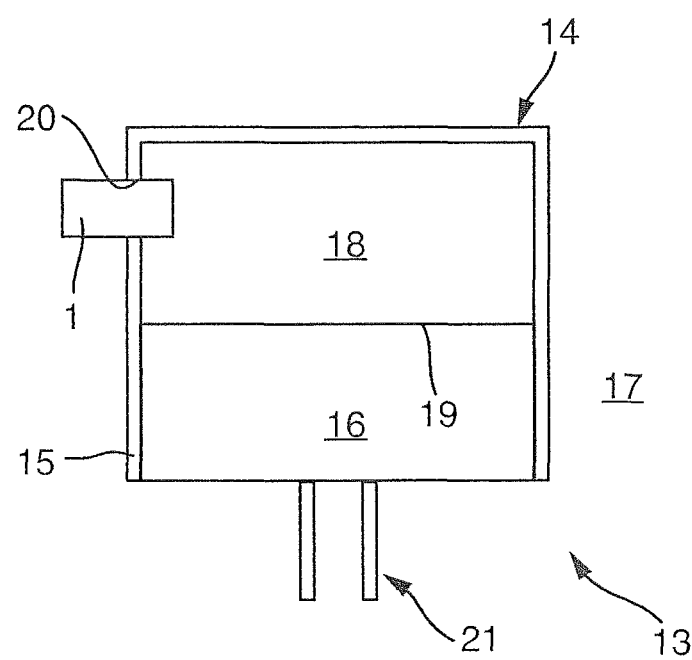
FIG. 5: is a schematic representation of a field device with a pressure-equalization element according to the invention.

FIG. 5 shows a schematic representation of a field device 13 with a pressure-equalization element 1 according to the invention. In the case shown, the field device 13 is a vibronic sensor. Corresponding sensors are offered and marketed by the applicant in different designs for different uses.

Like every sensor for determining and monitoring a process variable, in this case the limit level of a medium in a container, the density and/or viscosity of the medium, the field device 13 has a housing 14 in which the electronic components (not shown) are located, and a sensor element 21.

In the outer wall 15 of the housing 14 which separates the inner chamber 16, 18 with the electronic components from the outer surroundings 17, the pressure-equalization element 1 according to the invention is arranged in an opening 20. FIG. 5 also shows an embodiment of a field device 13 with two inner chambers 16,18. Depending upon the embodiment of the field device 13 and the requirements made of the field device 13, at least one pressure-equalization element 1 according to the invention is positioned in the outer wall of the inner chamber 16, and/or the inner chamber 18.

The invention claimed is:

1. A pressure-equalization element for equalizing differences in pressure between at least two spatial areas assigned to an automation field device, comprising:
   a main body which consists of a securing element with an axial hole which serves to fasten the pressure-equalization element in a wall of the field device;
   a protective cap; and
   a disc-shaped carrier component with a lateral end surface, wherein:
   a predetermined number (n, where n≥2) of cutouts that run substantially radially and correspond with said axial hole in said disc-shaped carrier component;
   said radially-running cutouts are offset from one another by a defined angular offset;
   said radially-running cutouts are provided with at least one liquid-blocking, gas-permeable membrane in the region of said lateral end surface of said disc-shaped carrier component;
   said protective cap covers said disc-shaped support component in the region of an end surface and said lateral end surface;
   said membrane is designed to be annular and is attached between two stop edges; and
   said membrane is a unidirectionally water-vapor permeable, water repellant, breathable membrane.

2. The pressure-equalization element according to claim 1, wherein:
   said angular offset of the number (n) of said radially-running cutouts is preferably 360°/n.

3. The pressure-equalization element according to claim 1, wherein:
   four radially-arranged cutouts are provided in said disc-shaped carrier component that basically have an angular offset of 90°.

4. The pressure-equalization element according to claim 1, wherein:
   said disk-shaped carrier component has a stop edge in each of two regions of said lateral end surface that are axially offset from each other.

5. An automation field device with at least one first inner chamber, wherein a pressure-equalization component is arranged in the wall of a housing of the field device which divides an inner chamber from the outer surroundings of the field device, said pressure-equalization component, comprising:
   a pressure-equalization element for equalizing differences in pressure between at least two spatial areas assigned to an automation filed device, comprising: a main body which consists of a securing element with an axial hole which serves to fasten the pressure-equalization element in a wall of the field device; a protective cap; and a disc-shaped carrier component with a lateral end surface, wherein: a predetermined number (n, where n≥2) of cutouts that run substantially radially and correspond with said axial hole in said disc-shaped carrier component; said radially-running cutouts are offset from one another by a defined angular offset; said radially-running cutouts are provided with at least one liquid-blocking, gas-permeable membrane in the region of said lateral end surface of said disc-shaped carrier component; said protective cap covers said disc-shaped support component in the region of an end surface and said lateral end surface;
   said membrane is designed to be annular and is attached between two stop edges; and
   said membrane is a unidirectionally water-vapor permeable, water repellant, breathable membrane.

6. An automation field device with at least one first inner chamber and a second inner chamber, wherein the first inner chamber and the second inner chamber are separated from each other by an intermediate wall, wherein a pressure-equalization component is arranged in the outer wall of at least one of said two inner chambers, said pressure-equalization component, comprising:
   a pressure-equalization element for equalizing differences in pressure between at least two spatial areas assigned to an automation filed device, comprising: a main body which consists of a securing element with an axial hole which serves to fasten the pressure-equalization element in a wall of the field device; a protective cap; and a disc-shaped carrier component with a lateral end surface, wherein: a predetermined number (n, where n≥2) of cutouts that run substantially radially and correspond with said axial hole in said disc-shaped carrier component; said radially-running cutouts are offset from one another by a defined angular offset; said radially-running cutouts are provided with at least one liquid-blocking, gas-permeable membrane in the region of said lateral end surface of said disc-shaped carrier component; said protective cap covers said disc-shaped support component in the region of an end surface and said lateral end surface;

said membrane is designed to be annular and is attached between two stop edges; and said membrane is a unidirectionally water-vapor permeable, water repellant, breathable membrane.

7. A relative pressure-measuring sensor for the meteorological detection of a pressure to be measured as a relative pressure in comparison to a reference pressure that predominates in the surroundings of the measuring sensor, comprising:

a housing;

the relative pressure sensor arranged in said housing;

a pressure supply by means of which the pressure to be measured is supplied to the relative pressure sensor; and a reference pressure supply by means of which the reference pressure is supplied to the relative pressure sensor, wherein the reference pressure supply terminates in the opening in an outer wall of said housing, wherein a pressure-equalization element is inserted in the opening or the reference pressure supply, said pressure-equalization comprises:

a pressure-equalization element for equalizing differences in pressure between at least two spatial areas assigned to an automation filed device, comprising: a main body which consists of a securing element with an axial hole which serves to fasten the pressure-equalization element in a wall of the field device; a protective cap; and a disc-shaped carrier component with a lateral end surface, wherein: a predetermined number (n, where n≥2) of cutouts that run substantially radially and correspond with said axial hole in said disc-shaped carrier component; said radially-running cutouts are offset from one another by a defined angular offset; said radially-running cutouts are provided with at least one liquid-blocking, gas-permeable membrane in the region of said lateral end surface of said disc-shaped carrier component; said protective cap covers said disc-shaped support component in the region of an end surface and said lateral end surface;

said membrane is designed to be annular and is attached between two stop edges; and said membrane is a unidirectionally water-vapor permeable, water repellant, breathable membrane.

* * * * *